(12) United States Patent
Scheurle et al.

(10) Patent No.: US 9,970,957 B2
(45) Date of Patent: May 15, 2018

(54) ROCKER DEVICE FOR A MICROMECHANICAL Z-SENSOR

(71) Applicant: Robert Bosch GmbH, Stuttgart (DE)

(72) Inventors: Andreas Scheurle, Leonberg (DE); Guenther-Nino-Carlo Ulrich, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 75 days.

(21) Appl. No.: 14/925,305

(22) Filed: Oct. 28, 2015

(65) Prior Publication Data

US 2016/0139172 A1    May 19, 2016

(30) Foreign Application Priority Data

Nov. 14, 2014  (DE) .................... 10 2014 223 314

(51) Int. Cl.
*G01P 15/125* (2006.01)
*G01P 15/08* (2006.01)

(52) U.S. Cl.
CPC .... *G01P 15/125* (2013.01); *B81B 2203/0181* (2013.01); *G01P 2015/0831* (2013.01)

(58) Field of Classification Search
CPC .......... G01P 15/125; G01P 2015/0831; B81B 2203/0181
See application file for complete search history.

(56) References Cited

U.S. PATENT DOCUMENTS

| 2010/0122578 A1* | 5/2010 | Classen ............... G01P 15/0802 |
| | | 73/514.32 |
| 2011/0056297 A1* | 3/2011 | Classen ................ G01P 15/125 |
| | | 73/514.32 |

FOREIGN PATENT DOCUMENTS

| DE | 10 2007 060 878 | 6/2009 |
| DE | 10 2009 000 167 | 7/2010 |
| EP | 0 244581 | 11/1987 |
| EP | 0 773 433 | 5/1997 |

* cited by examiner

*Primary Examiner* — Peter Macchiarolo
*Assistant Examiner* — Irving A Campbell
(74) *Attorney, Agent, or Firm* — Norton Rose Fulbright US LLP; Gerard Messina

(57) ABSTRACT

A rocker device for a micromechanical Z-sensor, including two rocker arms which are mounted around a torsion spring and which are asymmetric relative to the torsion spring; the rocker arms having first perforations; at least one of the rocker arms having at least one opening, a diameter of the first perforations being configured in a defined manner to be smaller than a diameter of the opening; and a cavity for connecting the first perforations to the at least one opening being formed in at least one of the rocker arms.

8 Claims, 3 Drawing Sheets

ROCKER DEVICE FOR A MICROMECHANICAL Z-SENSOR

RELATED APPLICATION INFORMATION

The present application claims priority to and the benefit of German patent application no. 10 2014 223 314.3, which was filed in Germany on Nov. 14, 2014, the disclosure of which is incorporated herein by reference.

FIELD OF THE INVENTION

The present invention relates to a rocker device for a micromechanical Z-sensor. The present invention also relates to a method for producing a rocker device for a micromechanical Z-sensor.

BACKGROUND INFORMATION

Conventional sensors for measuring physical acceleration usually have a micromechanical structure made of silicon (sensor core) and evaluation electronics. Sensor cores which make it possible to measure an acceleration in a direction orthogonal to a main plane of the sensor core are referred to as Z-sensors. Such sensors are used in the automobile sector, for example in ESP systems, or in the mobile telephony sector.

The aforementioned sensor principle is described in greater detail, for example, in Chapter 6 of the dissertation "Oberflächenmikromechanik-Sensoren als elektrische Teststrukturen zur Charakterisierung ihrer Herstellungsprozesse" ["Surface micromechanical sensors as electrical test structures for characterizing their manufacturing processes"]; Maute, Matthias; University of Tübingen, 2003.

Patent document EP 0 244 581 A1 discusses a micromechanical sensor for the purpose of automatic triggering of occupant protection devices.

Patent document EP 0 773 443 B1 discusses a micromechanical acceleration sensor.

Within the scope of the so-called "FP functionalization," which is discussed, for example, in DE 10 2007 060 878 A1 and DE 10 2009 000 167 A1, a rocker is formed for the micromechanical acceleration sensor, which is structured not just from a single compact layer but rather in two different silicon layers. Movable "trough-shaped" structures may thus be formed.

SUMMARY OF THE INVENTION

An object of the present invention is to provide a rocker device for a micromechanical Z-sensor having improved damping properties.

The object may be achieved according to a first aspect by a rocker device for a micromechanical Z-sensor, including:
   two rocker arms which are mounted around a torsion spring and which are asymmetric relative to the torsion spring;
   the rocker arms having first perforations;
   at least one of the rocker arms having at least one opening, a diameter of the first perforations being configured in a defined manner to be smaller than a diameter of the opening; and
   a cavity for connecting the first perforations to the at least one opening being formed in at least one of the rocker arms.

In this way, the rocker device according to the present invention may advantageously exhibit increased damping.

According to a second aspect, the object is achieved by a method for producing a rocker device for a micromechanical Z-sensor, including the steps:
   forming two asymmetric rocker arms;
   forming first perforations in a third functional layer of the rocker arms;
   forming at least one opening in a first functional layer of at least one of the rocker arms; and
   forming at least one cavity in at least one of the rocker arms, as a result of which the first perforations and the at least one opening are connected.

Specific embodiments of the rocker device according to the present invention and of the method according to the present invention are the subject matter of subclaims.

One advantageous refinement of the rocker device is characterized in that the first perforations have a surface area of approximately 0.5 µm×approximately 2 µm formed in an xy plane of the rocker device, and the opening has a surface area of approximately 2 µm×approximately 3 µm formed in the xy plane of the rocker device. In this way, specific dimensions are provided for the perforations and the blind hole, which benefit very much from the connecting cavity.

Another advantageous refinement of the rocker device provides that the first perforations are formed in a third functional layer of the rocker device. This aids an easy creation of the first perforations from a manufacturing point of view.

Another advantageous refinement of the rocker device is characterized in that the at least one opening is formed in a first functional layer of the rocker device. In terms of process technology, larger recesses are provided in the first functional layer than in the third functional layer.

Another advantageous refinement of the rocker device provides that the cavity is situated in a rocker arm having a first functional layer. In this way, sufficient mass exists for forming the connecting cavity.

The present invention will be described in detail below by further features and advantages, with reference to multiple figures. All described features form, per se or in any arbitrary combination, the subject matter of the present invention, regardless of their presentation in the description or in the figures and regardless of their summary in the patent claims or their back-reference. Identical or functionally equivalent elements bear identical reference numerals. The figures are provided qualitatively and not true to scale. Proportions and orders of magnitude thus cannot be ascertained from the figures.

DETAILED DESCRIPTION

Figure 1:
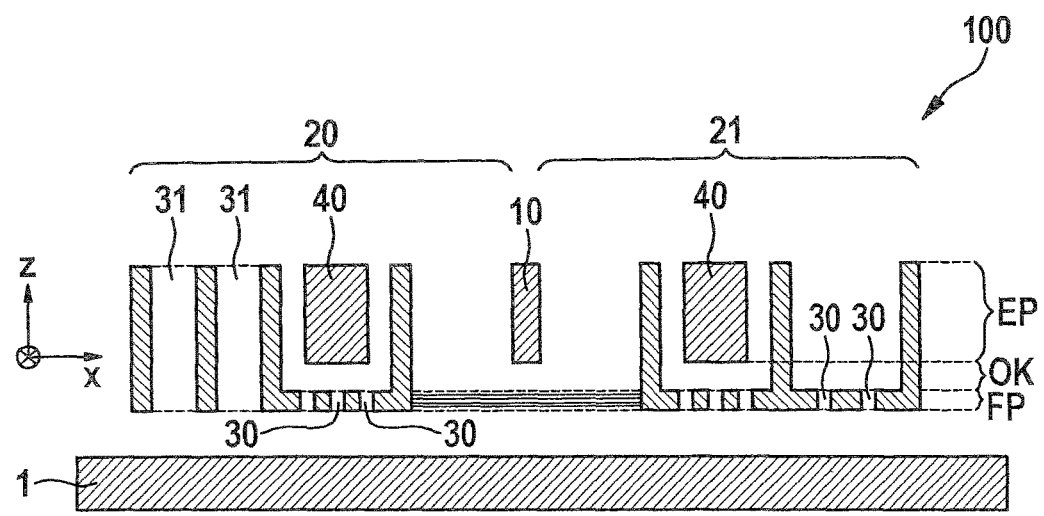
FIG. 1 shows a conventional rocker device for a micromechanical Z-sensor, in a cross-sectional view.

FIG. 1 shows, in highly simplified form, a conventional rocker device 100 for a micromechanical Z-sensor, in a cross-sectional view.

In the sectional view, it is apparent that the overall structure of rocker device 100 is created from three functional layers, namely from a first functional layer EP located at the top, from a second functional layer OK situated between first functional layer EP and a third functional layer FP, and from third functional layer FP located at the bottom. Second functional layer OK may also be omitted where necessary. Rocker device 100 has in rocker arms 20, 21 first perforations 30 which may be formed in third functional layer FP. Second perforations 31 are situated in first functional layer EP of rocker arm 21, the diameter of the second perforations being greater than that of first perforations 30.

A size of the through-holes of first perforations 30 ranges from approximately 0.5 µm to approximately 2 µm. A size of the through-holes of second perforations 31 ranges from approximately 2 µm to approximately 3 µm. The differences in the aforementioned perforations 30, 31 are process related and may be varied only to a limited extent. They are based primarily on the fact that underlying layers may be etched away with the aid of an etching gas during the manufacturing process. With the aid of a torsion spring 10, which is configured with a defined stiffness, the structure of rocker device 100 is mounted on a silicon substrate 1 in a rotatable or twistable manner or is suspended thereon.

It is apparent that rocker arms 20, 21 are asymmetric relative to torsion spring 10 due to unequal mass distributions. In the case of rocker arms 20, 21 of essentially equal length (geometric symmetry), the asymmetry may be formed by an asymmetric mass distribution of rocker arms 20, 21, for example due to the abovementioned different perforations 30, 31 of rocker arms 20, 21 or due to different thicknesses of the two rocker arms 20, 21. However, the asymmetry may additionally or alternatively also be achieved by an asymmetry of a geometry of the two rocker arms 20, 21 (for example, different arm lengths).

As a consequence of an acceleration acting orthogonally to a main plane of rocker device 100 (vertical acceleration in the z direction), the structure of rocker device 100 may twist around torsion spring 10 due to the asymmetry of the two rocker arms 20, 21. Rocker device 100 is kept at a defined electric potential by an electronic circuit (not shown), while stationary second electrodes (not shown), which are situated below rocker device 100 and which are used for measuring purposes, are kept at different defined electric potentials. The "trough-shaped" structures of rocker arms 20, 21 are apparent, stationary electrodes 40 being situated above the trough-shaped structures.

With the aid of an electronic evaluation device (not shown), a change in inclination of rocker device 100 is detected by sensing and evaluating charge changes on the electrodes. In this way, a vertical acceleration ("in the z direction") acting on micromechanical Z-sensor 200 may be ascertained.

Figure 2:
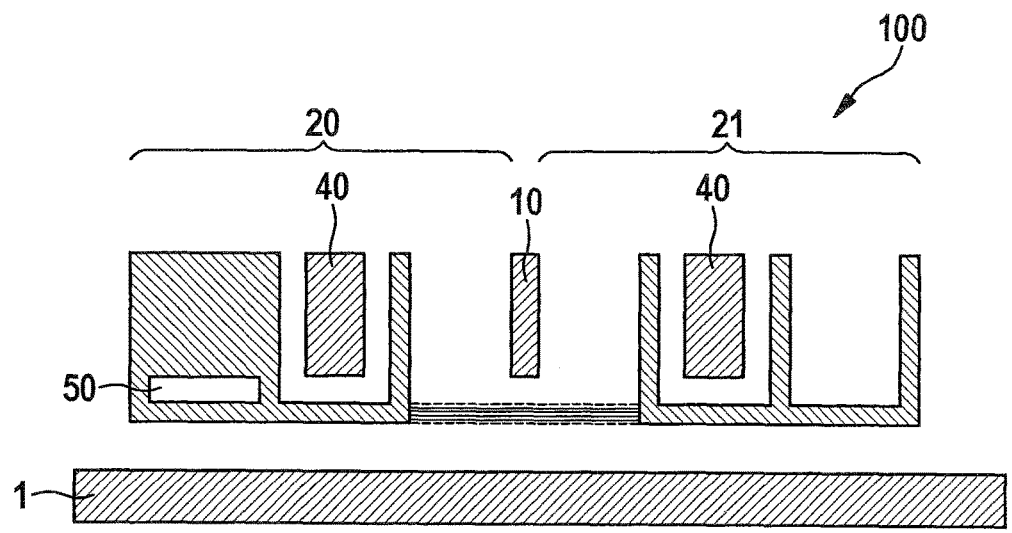
FIG. 2 shows one specific embodiment, represented in simplified form, of a rocker device according to the present invention for a micromechanical Z-sensor.

FIG. 2 shows that it is provided according to the present invention to form in rocker arm 20 a cavity 50 for connecting first perforation 30 (not shown in FIG. 2) to at least one opening 32 (not shown in FIG. 2). The diameters of openings 32 correspond here to the diameters of perforations 31. Cavity 50 may be formed in a rocker arm 20, 21 in which a first functional layer EP of sufficient mass is present, so that a functional (mechanical and electrical) connection of the functional layers FP and EP is ensured.

Figure 3:
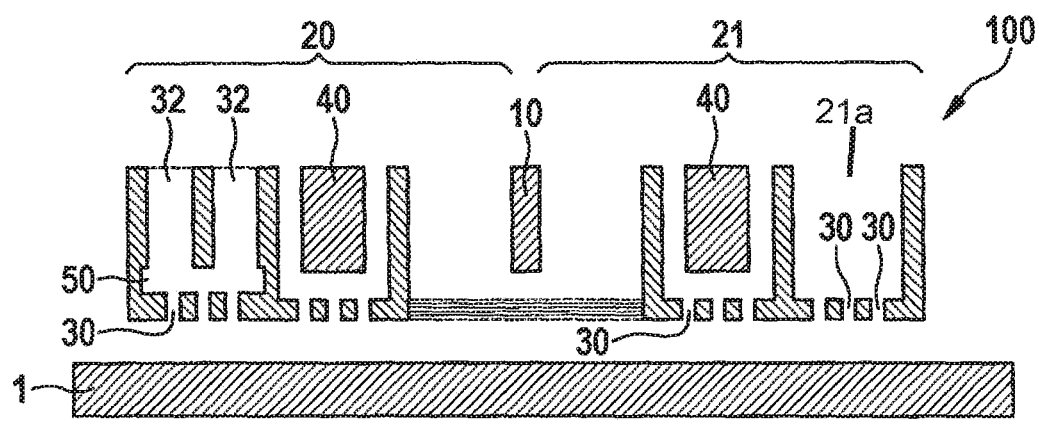
FIG. 3 shows one specific embodiment of a rocker device according to the present invention for a micromechanical Z-sensor.

FIG. 3 shows one specific embodiment of a rocker device 100 configured according to the present invention, in a cross-sectional view. Due to the connection, implemented with the aid of cavity 50, between first perforations 30 and openings 32 in rocker arm 20, rocker arm 20 may now exhibit an essentially identical damping behavior as that of rocker arm 21 because only first perforations 30 are implemented on the underside of rocker device 100. As a result, this helps to achieve a highly symmetrical damping behavior of the two rocker arms 20, 21. Reference numeral 21a denotes an area of rocker arm 21 which has first perforations 30.

In order to create cavity 50, first perforations 30 are initially formed in third functional layer FP of rocker arms 20, 21. One or multiple openings 32 are then formed in first functional layer EP. Finally, a cavity 50 is formed in rocker arm 20 in such a way that a fluidic continuous connection between first perforations 30 and openings 32 is implemented. As a result, an essentially uniform perforation of the underside of the entire rocker structure is achieved in the form of first perforations 30, as a result of which a uniform damping behavior of the entire rocker device 100 is achieved.

In a variant (not shown), cavity 50 may additionally also be situated in rocker arm 21. Cavity 50 may be formed essentially anywhere where there is a first functional layer EP of sufficient mass. It is also conceivable (not shown) that multiple cavities 50 are also formed in each of the two rocker arms 20, 21.

The number or the positioning of the aforementioned perforations 30, openings 32 and cavities 50 may be adapted to a geometry or to a design of rocker device 100. All numbers, dimensions and arrangements of the aforementioned elements in the figures are therefore to be regarded as being shown by way of example and for quality purposes.

Figure 4:
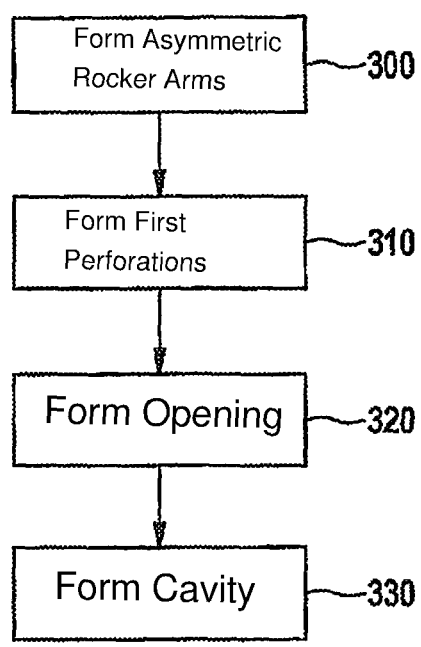
FIG. 4 shows a basic flow chart of one specific embodiment of the method according to the present invention.

FIG. 4 shows a basic flow chart of one specific embodiment of the method according to the present invention.

FIG. 5 shows a basic flow chart of one specific embodiment of the method according to the present invention.

In a first step 300, two asymmetric rocker arms 20, 21 are formed.

In a second step 310, first perforations 30 are formed in a third functional layer FP of rocker arms 20, 21.

In a third step 320, at least one opening 32 is formed in a first functional layer EP of at least one of rocker arms 20, 21.

Finally, in a fourth step 330, at least one cavity 50 is formed in at least one of rocker arms 20, 21, as a result of which first perforations 30 and the at least one opening 32 are connected.

In summary, the present invention provides a rocker device for a micromechanical Z-sensor which permits improved damping properties and thus an improved performance of the Z-sensor. The improved damping properties are based on the fact that a uniform perforation structure is created on the underside of the rocker device. This aim may be achieved in a technically simple manner with the aid of a connecting cavity in at least one of the rocker arms.

It is advantageously also possible to apply the principle according to the present invention to other sensor technologies, for example to piezoresistive micromechanical acceleration sensors.

Although the present invention has been described on the basis of specific embodiments, it is in no way limited thereto. Those skilled in the art will recognize that various modifications, which have not been described or have been described only partially above, are possible without departing from the core of the present invention.

What is claimed is:

1. A rocker device for a micromechanical Z-sensor, comprising:
    two rocker arms which are mounted around a torsion spring and which are asymmetric relative to the torsion spring, an underside of each of the rocker arms having first perforations disposed along an entirety of the underside;
    wherein at least one of the rocker arms has at least one opening, a diameter of the first perforations being configured in a defined manner to be smaller than a diameter of the opening,
    wherein a cavity for connecting the first perforations to the at least one opening is formed in at least one of the rocker arms, and
    wherein a width of the cavity along a dimension that is parallel to the underside is wider than a width of the at least one opening.

2. The rocker device of claim 1, wherein the first perforations have a surface area of 0.5 μm×2 μm formed in an xy plane of the rocker device, and the opening has a surface area of 2 μm×3 μm formed in the xy plane of the rocker device.

3. The rocker device of claim 1, wherein the first perforations are formed in a third functional layer of the rocker device.

4. The rocker device of claim 1, wherein the at least one opening is formed in a first functional layer of the rocker device.

5. The rocker device of claim 1, wherein the cavity is situated in a rocker arm having a first functional layer.

6. A micromechanical Z-sensor, comprising:
    a rocker device for a micromechanical Z-sensor, including two rocker arms which are mounted around a torsion spring and which are asymmetric relative to the torsion spring, an underside of each of the rocker arms having first perforations disposed along an entirety of the underside;
    wherein at least one of the rocker arms has at least one opening, a diameter of the first perforations being configured in a defined manner to be smaller than a diameter of the opening,
    wherein a cavity for connecting the first perforations to the at least one opening is formed in at least one of the rocker arms, and
    wherein a width of the cavity along a dimension that is parallel to the underside is wider than a width of the at least one opening.

7. A method for producing a rocker device for a micromechanical Z-sensor, the method comprising:
    forming two asymmetric rocker arms;
    forming first perforations in a third functional layer of the rocker arms so that an underside of each of the rocker arms include the first perforations disposed along an entirety of the underside;
    forming at least one opening in a first functional layer of at least one of the rocker arms; and
    forming at least one cavity in at least one of the rocker arms, as a result of which the first perforations and the at least one opening are connected, wherein a width of the cavity along a dimension that is parallel to the underside is wider than a width of the at least one opening.

8. The method of claim 7, wherein the cavity is formed in a rocker arm having a first functional layer.

* * * * *